United States Patent
Paul et al.

(10) Patent No.: US 10,065,744 B2
(45) Date of Patent: Sep. 4, 2018

(54) SYSTEM AND METHOD FOR USING AN ENGINE MODEL FOR MULTIPLE FUNCTIONS

(71) Applicant: General Electric Company, Schenectady, NY (US)

(72) Inventors: Jacques Paul, Somerville, MA (US); Alejandro Aparicio, Chelsea, MA (US); George Luo, Boston, MA (US); Tarik Yardibi, Reading, MA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/291,167

(22) Filed: Oct. 12, 2016

(65) Prior Publication Data
US 2018/0099760 A1   Apr. 12, 2018

(51) Int. Cl.
*B64D 31/06* (2006.01)
*G06F 17/50* (2006.01)
*G05B 17/02* (2006.01)

(52) U.S. Cl.
CPC ............ *B64D 31/06* (2013.01); *G05B 17/02* (2013.01); *G06F 17/5009* (2013.01)

(58) Field of Classification Search
CPC ...... B64D 31/06; G06F 17/5009; G05B 17/02
USPC ........................................................ 701/100
See application file for complete search history.

(56) References Cited

U.S. PATENT DOCUMENTS

| 6,539,783 | B1 | 4/2003 | Adibhatla |
| 7,603,222 | B2 | 10/2009 | Wiseman et al. |
| 7,853,441 | B2 | 12/2010 | Volponi et al. |
| 9,091,616 | B2 | 7/2015 | Moeckly et al. |
| 9,269,206 | B2 | 2/2016 | Foiret |
| 9,317,249 | B2 | 4/2016 | Moeckly et al. |
| 9,367,970 | B2 | 6/2016 | Ziarno |
| 2006/0235665 | A1 | 10/2006 | Dwyer et al. |
| 2011/0077783 | A1 | 3/2011 | Karpman et al. |
| 2016/0177856 | A1 | 6/2016 | Martinez et al. |

FOREIGN PATENT DOCUMENTS

| EP | 1 790 838 A1 | 5/2007 |
| WO | 2014/143707 A1 | 9/2014 |
| WO | 2016/133578 A2 | 8/2016 |

OTHER PUBLICATIONS

International Search Report and Written Opinion issued in connection with corresponding PCT Application No. PCT/US2017/044777 dated Mar. 2, 2018.

*Primary Examiner* — Brian P Sweeney
(74) *Attorney, Agent, or Firm* — General Electric Company; Pamela Kachur (57) ABSTRACT

Systems and methods for modelling an engine in a vehicle are provided. A method can include determining a first solver for modelling the engine. The first solver can include a first routine configured for determining one or more parameters of the engine. The method can further include obtaining a first set of inputs associated with the first solver. The first set of inputs can include one or more inputs obtained from the first solver and one or more previous engine states. The method can further include modelling the engine based at least in part on the first set of inputs to generate a first set of outputs. The first set of outputs can include one or more parameters of the engine and one or more engine states. The method can further include providing the one or more parameters to the solver.

20 Claims, 5 Drawing Sheets

SYSTEM AND METHOD FOR USING AN ENGINE MODEL FOR MULTIPLE FUNCTIONS

GOVERNMENT SUPPORT CLAUSE

This invention was made with Government support under contract number W911W6-13-2-0005 awarded by the Department of Defense. The Government has certain rights in the invention.

FIELD OF THE INVENTION

The present subject matter relates generally to modelling an engine in a vehicle, and more particularly, to using an embedded engine model to model multiple functions for an engine on an aircraft.

BACKGROUND OF THE INVENTION

Engines on a vehicle, and in particular, engines on an aircraft, are commonly controlled by a controller, such as a Full Authority Digital Engine Control (FADEC) on an aircraft. For example, a controller (e.g., an Electronic Engine Controller (EEC) or Electronic Control Unit (ECU) of a FADEC) can use actuators to control fuel flow, engine geometries, and other parameters to optimize performance of an engine during operation, such as during takeoff, flight and landing for an aircraft.

During operation of the engine, various parameters of the engine can be modelled by an engine model, such as an Embedded Engine Model (EEM) run on a controller. Multiple solvers can be used by the controller to model various operating scenarios, such as an engine tracking solver to provide real-time virtual sensors for the engine, a high-power solver to determine available engine performance reserves, or a general control solver to provide general control tasks for the engine. Each solver can be tailored to determine one or more parameters of the engine by modelling specific inputs in the engine model.

However, in a typical implementation, each solver is run through the engine model in a sequential manner. Thus, each solver generally is run until the solver determines the one or more desired parameters before a successive solver is run through the engine model. For instances in which the solver is required to perform an iterative process, running each solver until it determines the desired parameters can be time and computationally intensive, and can take 20 minutes or longer in some cases. Thus, in applications in which a user or controller desires to know multiple modelled parameters in a short time period, such as in a nearly simultaneous time period, the typical approach of running multiple solvers through an engine model sequentially may not provide the desired functionality.

BRIEF DESCRIPTION OF THE INVENTION

Aspects and advantages of embodiments of the present disclosure will be set forth in part in the following description, or may be learned from the description, or may be learned through practice of the embodiments.

One example aspect of the present disclosure is directed to a method of modelling an engine on a vehicle. The method can include determining, by one or more processors, a first solver for modelling the engine. The first solver can include a first routine configured for determining one or more parameters of the engine. The method can further include obtaining, by the one or more processors, a first set of inputs associated with the first solver. The first set of inputs can include one or more inputs obtained from the first solver and one or more previous engine states. The method can further include modelling, by the one or more processors, the engine based at least in part on the first set of inputs to generate a first set of outputs. The first set of outputs can include one or more parameters of the engine and one or more engine states. The method can further include providing, by the one or more processors, the one or more parameters to the solver.

Another example aspect of the present disclosure is directed to a system for modelling an engine on an aircraft. The system can include one or more processors and one or more memory devices. The one or more memory devices can store instructions that when executed by the one or more processors configure the one or more processors to perform operations. The operations can configure the one or more processors to determine a first solver for modelling the engine. The first solver can include a first routine configured for determining one or more parameters of the engine. The operations can further configure the one or more processors to obtain a first set of inputs associated with the first solver. The first set of inputs can include one or more inputs obtained from the first solver and one or more previous engine states. The operations can further configure the one or more processors to model the engine based at least in part on the first set of inputs to generate a first set of outputs. The first set of outputs can include one or more parameters of the engine and one or more engine states. The operations can further configure the one or more processors to provide the one or more parameters to the solver.

Yet another example aspect of the present disclosure is directed to an aircraft. The aircraft can include a fuselage, at least one engine, and a controller configured to control the at least one engine. The controller can include one or more processors and one or more memory devices. The one or more memory devices can store instructions that when executed by the one or more processors configure the one or more processors to perform operations. The operations can configure the processor to select a first solver for modelling the engine from a plurality of solvers. Each solver can include a routine configured for determining one or more parameters of the engine. The operations can further configure the processor to obtain a first set of inputs associated with the first solver. The first set of inputs can include one or more inputs obtained from the first solver and one or more previous engine states. The operations can further configure the processor to model the engine based at least in part on the first set of inputs to generate a first set of outputs. The first set of outputs can include one or more parameters of the engine and one or more engine states. The operations can further configure the processor to provide the one or more parameters to the solver.

Other example aspects of the present disclosure are directed to systems, methods, vehicles, devices, and non-transitory computer-readable media for modelling an engine.

Variations and modifications can be made to these example aspects of the present disclosure.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION OF THE INVENTION

Reference now will be made in detail to embodiments of the present disclosure, one or more example(s) of which are illustrated in the drawings. Each example is provided by way of explanation of the present disclosure, not limitation of the present disclosure. In fact, it will be apparent to those skilled in the art that various modifications and variations can be made in the present disclosure without departing from the scope or spirit of the present disclosure. For instance, features illustrated or described as part of one embodiment can be used with another embodiment to yield a still further embodiment. Thus, it is intended that the present disclosure covers such modifications and variations as come within the scope of the appended claims and their equivalents.

Example aspects of the present disclosure are directed to systems and methods of modelling an engine in a vehicle, such as an aircraft, helicopter, automobile, boat, submarine, train, and/or any other suitable vehicle. For instance, an aircraft can include an engine configured to be controlled by a controller. The controller can be, for example, a controller, such as a FADEC, configured to control various components of the engine. During operation of the engine, the controller can be configured to model various parameters of the engine. For example, a complex, high-fidelity simulation of an engine, such as an Embedded Engine Model (EEM), can be run on the controller in real-time to model the engine.

In a typical embodiment, such as a method or system employed in the prior art, a solver can be used to determine one or more parameters of the engine by modeling a set of inputs in the engine model. For example, a solver can be a routine configured for determining one or more parameters of the engine. The solver can be configured to determine the one or more parameters by, for example, performing an iterative process or modeling a specific set of inputs in the engine model. Further, multiple solvers can be used to model various operating conditions or states to determine different parameters of the engine, such as a first solver to provide real-time virtual sensors, a second solver to tune the engine model to match the engine with a tracking filter, a third solver to model a high-power condition to determine a power reserve for the engine, and a fourth solver to perform general control tasks for the engine. Each solver can be configured to determine the one or more parameters of the engine by modeling specific conditions in the engine model.

For example, a solver can provide one or more inputs to an engine model, such as an embedded engine model running on a controller. The engine model can model the one or more inputs to generate a set of outputs. The set of outputs can then be provided to the solver. The solver can then use the set of outputs to determine the one or more parameters of the engine. For example, the set of outputs can be used by the solver as feedback to incrementally increase one or more of the inputs in an iterative process until the set of outputs from the model converges or comes within a threshold margin of error with an expected outcome. The solver can then determine the one or more parameters based on the outputs from the model.

However, in a typical implementation as used in the prior art, each solver is run sequentially, such as a first solver, a second solver, and so on. Thus, each solver must complete its task, such as converge upon the result sought by the solver, before a successive solver can be run through the engine model. Moreover, in a typical implementation as used in the prior art, each solver is run from a zero state, meaning that each solver is initiated from a consistent starting point with an initial set of inputs each time the solver is run. However, in instances in which one of the solvers is an iterative routine or complex calculation, this can be a very time intensive process, and may take as long as 20 minutes to perform. In situations in which a user of the engine model, such as an operator of the vehicle or a controller of the engine, desires to know multiple parameters of the engine in a nearly simultaneous manner, running the solver sequentially may be insufficient to determine the one or more parameters in the timeframe required. One current approach to addressing this issue is to run multiple engine models on separate controllers, with each controller running a single solver at a time. However, this can dramatically increase the hardware requirements for an engine, which can increase the cost of the engine. Further, this can increase the complexity of the engine as well as any associated maintenance on the engine, such as when an engine model is updated, as each engine model on each engine controller will need to be updated.

For example, during operation of an aircraft, a controller configured to control an engine on the aircraft may require one or more modeled parameters as inputs to a control algorithm for the engine, such an ECU configured to control various components of the engine. The controller may need to model the temperature or another parameter at different points in the engine using the engine model in order to determine operational limits and control schemes for the engine. Using a solver configured to determine the temperature or another parameter at various points in the engine, the controller can model the engine, and output the temperature at the various points to the ECU as a "virtual sensor" input, which can then be used by the controller to control the engine. However, at the same time, a pilot may desire to know several operational parameters for the engine, such as how far the pilot can fly with the available fuel reserves or the thrust, shaft torque, or power available for the engine under a high-power condition. Each of these parameters may be determinable using an appropriate solver, but in an instance such as this when multiple parameters are desired to be determined in a nearly simultaneous manner, running the solvers sequentially may not provide the functionality desired or required by the pilot or the controller.

The systems and methods according to example aspects of the present disclosure can allow for the nearly simultaneous determination of multiple parameters of an engine. For example, a plurality of solvers can each be configured to determine one or more parameters of an engine. Each solver can be, for example, a routine configured to perform a series of calculations and/or iterations by providing one or more inputs to be used by an engine model. A processor can be configured to determine a first solver for modeling the engine. For example, an input selector unit can be configured to determine a first solver for modeling the engine. As used herein, the term "unit" refers to any computer readable instructions or logic that when executed provide the functionality described herein. For example, an input handling unit can include computer readable instructions configured to provide one or more inputs to an engine model. In an embodiment, the input selector unit can be configured to determine the first solver based on a schedule. The schedule can be, for example, a predetermined priority order or a logic to determine a priority order of the plurality of solvers.

The processor can further be configured to obtain a first set of inputs associated with the first solver. For example, the first solver can be configured to provide the one or more inputs to a first input handling unit associated with the first solver. The first input handling unit can be configured to combine the one or more inputs from the solver with one or more previous engine states. In an embodiment, the one or more previous engine states can be one or more engine states from previously modeling the engine with the first solver. The input selector unit can be further configured to obtain the first set of inputs from the first input handling unit.

The processor can further be configured to model the engine based at least in part on the first set of inputs to generate a first set of outputs. The first set of outputs can include one or more parameters of the engine and one or more engine states. In an embodiment, the input selector unit can be configured to provide the first set of inputs to the engine model. In an embodiment, the engine model can be an embedded engine model in a controller on an aircraft. The embedded engine model can be configured to simulate the operation of an aircraft engine. The engine model can then model the engine using the first set of inputs to generate a first set of outputs. The engine model can then provide the first set of outputs to an output selector unit. The output selector unit can be configured to provide the first set of outputs to a first output handling unit associated with the first solver. The first output handling unit can be configured to provide the one or more parameters to the first solver. The one or more parameters can be, for example, the one or more parameters that the solver is configured to determine. The one or more parameters can additionally be one or more feedback parameters used by the solver to determine the one or more parameters that the solver is configured to determine. The first output handling unit can further be configured to provide the one or more engine states from the first set of outputs to the first input handling unit. For example, the first input handling unit can be configured to generate a second set of inputs to be provided to the engine model, wherein the second set of inputs includes the one or more engine states previously provided by the first output handling unit. The second set of inputs can be, for example, a set of inputs used in an iterative process by the first solver.

In an embodiment, the processor can be configured to perform a control action for the engine based at least upon the one or more parameters. For example the one or more parameters can be provided to a controller, such as an ECU, to control the engine. In an embodiment, the processor can be configured to provide the one or more parameters for display to a user, such as a pilot in a cockpit on an aircraft. In an embodiment, the processor can be further configured to determine a second solver for modeling the engine. The second solver, like the first solver, can be a routine configured to determine at least one parameter of the engine.

In this way, the systems and methods according to example aspects of the present disclosure can have a technical effect of allowing for a single engine model, such as an embedded engine model in a controller, to be used to model multiple parameters of an engine using multiple solvers in a nearly simultaneous manner. For example an input selector unit can rotate between running multiple solvers on an engine model by loading inputs associated with each solver and providing the modeled outputs to a respective output handling unit for each solver such that when each solver is selected by the input selector unit, the one or more previous engine states from previously running the solver are included in a set of inputs provided by the associated input handling unit. This can allow for an input selector unit to run a solver through the engine model without starting from a zero state, as in the prior art. Further, this can allow for a single engine model on a single controller to be used, thereby eliminating the need for separate engine models on separate controllers to be used for each solver. This can further reduce the costs associated with an engine, and reduce the likelihood of coding errors, as only a single engine model will need to be updated during maintenance operations.

Reference will now be made in detail to present embodiments of the invention, one or more examples of which are illustrated in the accompanying drawings. The detailed description uses numerical and letter designations to refer to features in the drawings. Like or similar designations in the drawings and description have been used to refer to like or similar parts of the invention. As used herein, the terms "first", "second", and "third" may be used interchangeably to distinguish one component from another and are not intended to signify location or importance of the individual components.

Figure 1:
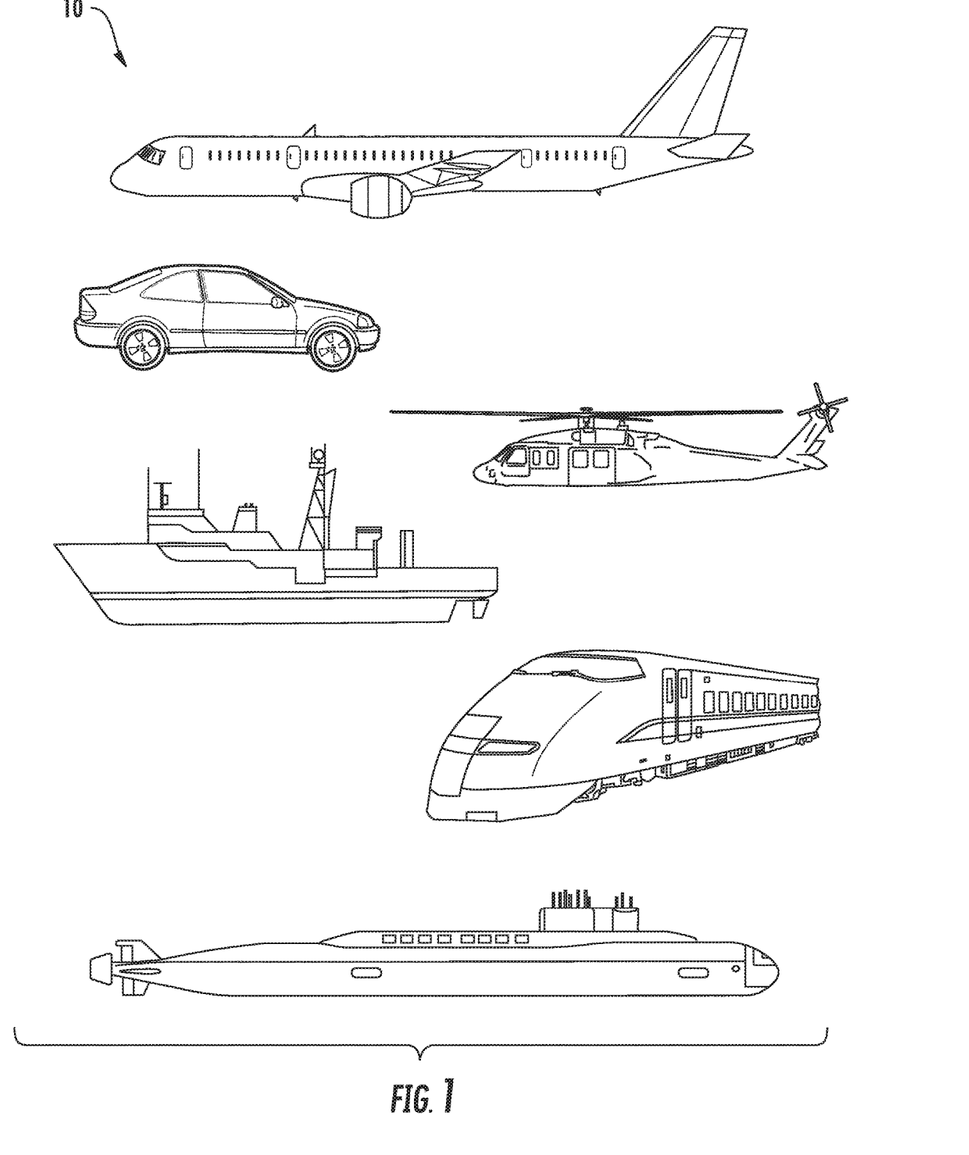
FIG. 1 depicts example vehicles according to example embodiments of the present disclosure.

Referring now to FIG. 1, example vehicles 10 according to example embodiments of the present disclosure are depicted. The systems and methods of the present disclosure can be implemented on an aircraft, helicopter, automobile, boat, submarine, train, and/or any other suitable vehicles. While the present disclosure is described herein with reference to an aircraft implementation, this is intended only to serve as an example and not to be limiting. One of ordinary skill in the art would understand that the systems and methods of the present disclosure can be implemented on other vehicles without deviating from the scope of the present disclosure.

Figure 2:
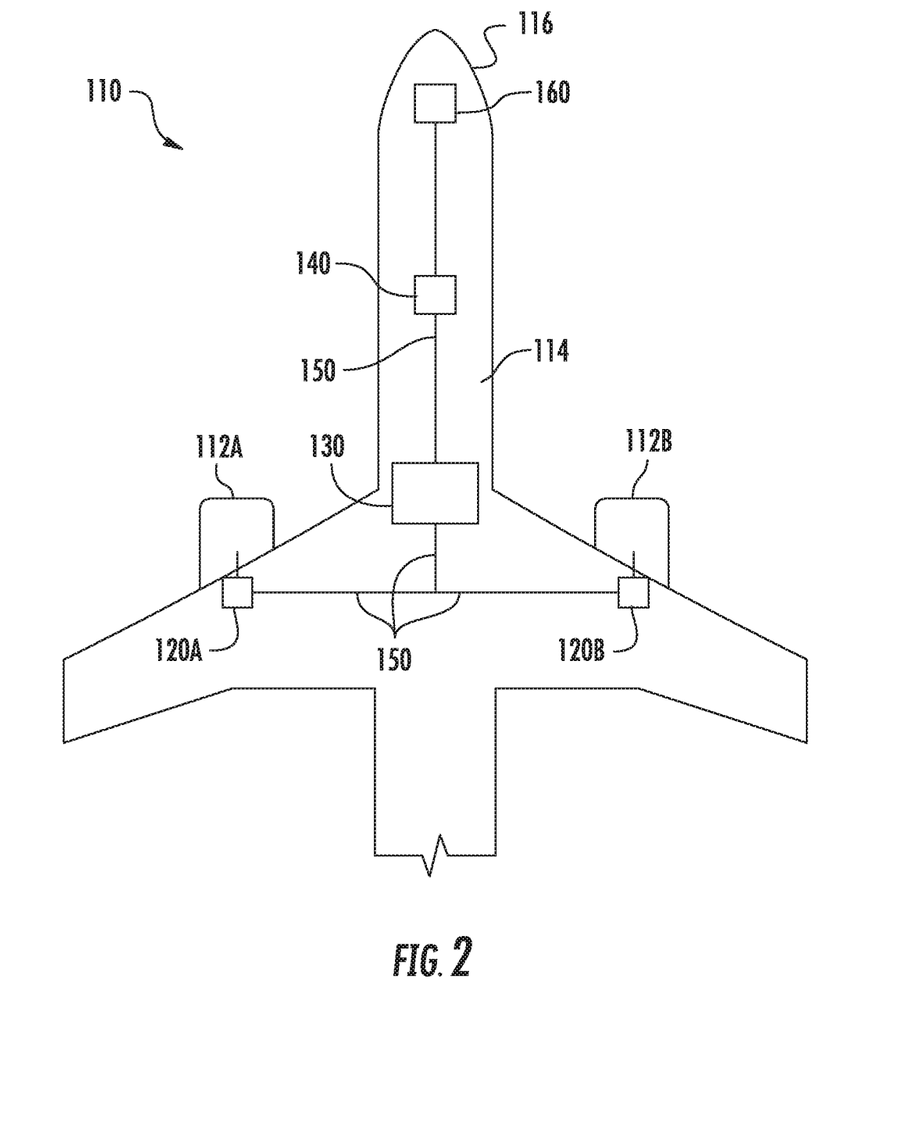
FIG. 2 depicts an example aircraft according to example embodiments of the present disclosure.

Referring now to FIG. 2, an example aircraft 110 according to example embodiments of the present disclosure is depicted. As shown, the aircraft 110 can include one or more engine(s) 112, a fuselage 114, a cockpit 116, and one or more controller(s) 120 configured to control the one or more engine(s) 112. For example, as depicted in FIG. 2, aircraft 110 includes two engines 112A and 112B, which are controlled by two controllers 120A and 120B, respectively. Each controller 120 can include, for example, an Electronic Engine Controller (EEC) or an Electronic Control Unit (ECU) of a Full Authority Digital Engine Control (FADEC). Each controller 120 can further include an Embedded Engine Model (EEM) or other engine model configured to simulate the operation of an engine 112 under various operating conditions. Each controller 120 can include various components for performing various operations and functions. For example, and as further described herein, each controller 120 can include one or more processor(s) and one or more memory device(s). The one or more memory device(s) can store instructions that when executed by the one or more processor(s) cause the one or more processor(s)

to perform the operations and functions, for example, as those described herein for modelling an engine on a vehicle 10.

Referring still to FIG. 2, the aircraft 110 can also include a communication network 130, such as an avionics network. Communication network 130 can include, for example, a local area network (LAN), a wide area network (WAN), SATCOM network, VHF network, a HF network, a Wi-Fi network, a WiMAX network, a gatelink network, and/or any other suitable communications network for transmitting messages to and/or from a vehicle 10. Such networking environments are commonplace in office-wide or enterprise-wide computer networks, intranets and the internet and may use a wide variety of different communication protocols. Those skilled in the art will appreciate that such network computing environments will typically encompass many types of computer system configuration, including personal computers, hand-held devices, multiprocessor systems, microprocessor-based or programmable consumer electronics, network PCs, minicomputers, mainframe computers, and the like. One or more computing devices 140 can be connected to the communication network 130 via one or more communication cables 150. The computing device(s) 140 can include various components for performing various operations and functions. For example, and as further described herein, the computing device(s) 140 can include one or more processor(s) and one or more memory device(s). The one or more memory device(s) can store instructions that when executed by the one or more processor(s) cause the one or more processor(s) to perform the operations and functions, for example, as those described herein for modelling an engine on a vehicle 10. The one or more computing devices 140 can be connected to one or more display devices 160, such as one or more display devices located in cockpit 116. The one or more display devices 160 can be configured to display information to a user, such as a pilot. The communication network 130 can include a data bus or a combination of wired and/or wireless communication links. The communication network 130 can also be coupled to the one or more controllers 120 by one or more communication cables 150. The one or more controllers 120 can be configured to communicate with the one or more computing devices 140 via the communication network 130.

Figure 3:
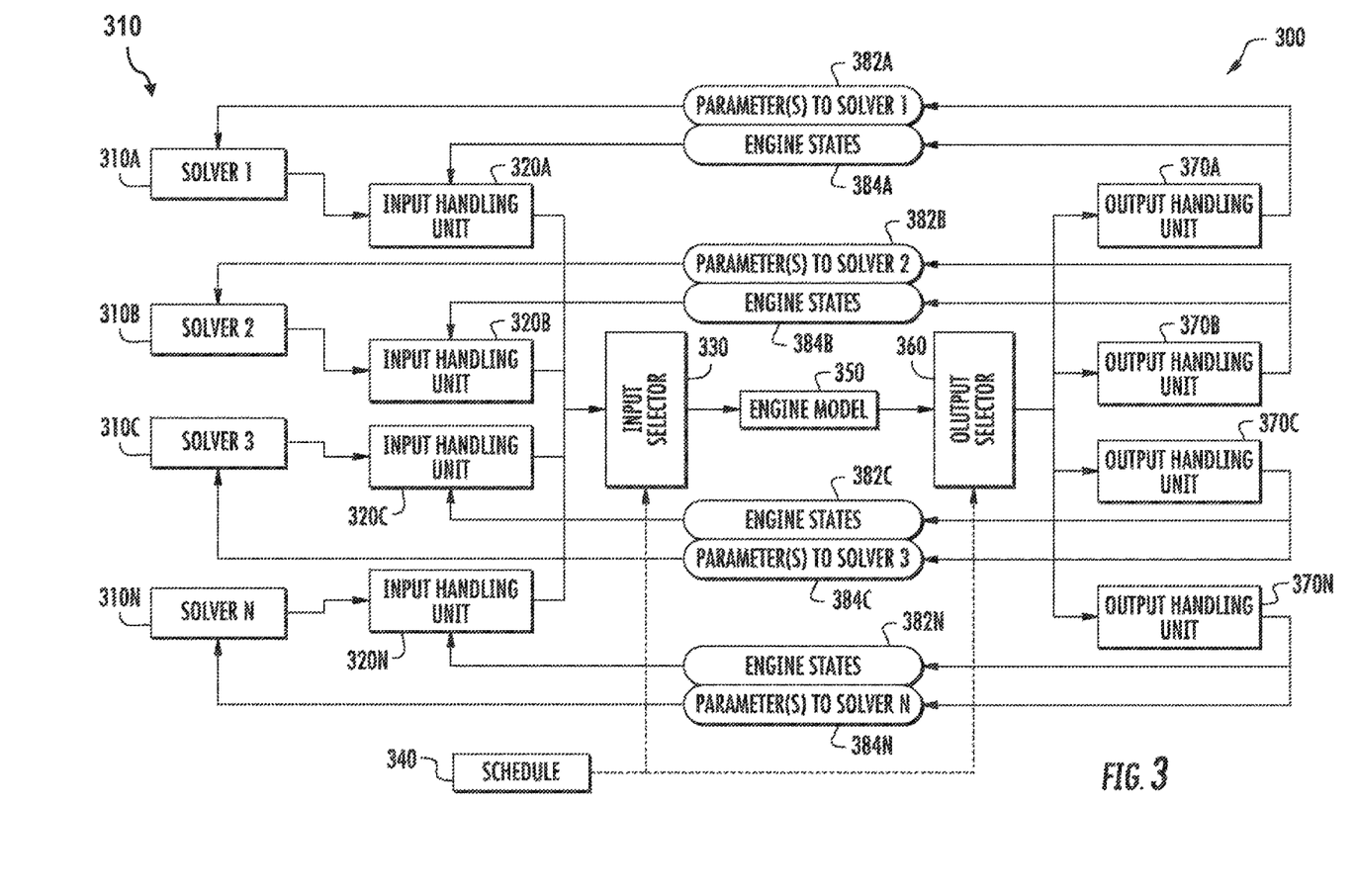
FIG. 3 depicts an example system according to example embodiments of the present disclosure.

Referring now to FIG. 3, a block diagram of an example system 300 for modelling an engine according to example aspects of the present disclosure is depicted. System 300 can be implemented in a vehicle 10, such an aircraft, helicopter, automobile, boat, submarine, train, and/or any other suitable vehicles.

As shown, the system 300 can include a plurality of solvers 310. For example, as shown in FIG. 3, four solvers are shown, a first solver 310A, a second solver 310B, a third solver 310C, and a fourth solver 310N. In an embodiment not depicted in FIG. 3, any number of solvers 310 can be included in system 300. Each solver can be a routine configured to determine one or more parameters of an engine, such as an engine 112 on an aircraft 110. For example, a first solver can be configured to track the engine with an engine model, such as an EEM, to provide real-time virtual sensors for the engine 112. For example, the real-time virtual sensors could be one or more modeled sensors, such as one or more virtual thermometers configured to determine the temperature at one or more locations in the engine in which a physical sensor would be difficult or impossible to implement. Other virtual sensors could similarly be modeled by a solver, such as virtual sensors configured to determine airflows, physical stresses, or other parameters. A second solver can be configured to tune an engine model, such as an EEM, to match the engine with a tracking filter. For example the solver can be configured to receive one or more inputs from one or more sensors located in the engine, and based on the inputs from the sensors, the second solver can tune the engine model to match the performance of the engine. In this way, the engine model can account for real-time operational performance variations, such as variations due to engine deterioration, operating conditions, or other conditions. A third solver can be configured to run an engine model for a high-power condition. For example a user of the engine, such as a pilot in an aircraft, may desire to know how much reserve thrust, shaft torque, or power an aircraft engine is capable of providing in real-time. The available thrust, shaft torque, or power may be dependent upon the operating conditions of the engine, such as the type of fuel, the altitude of the aircraft, the orientation of various control surfaces, weather conditions, or other parameters. The third solver can be configured to determine the available thrust, shaft torque, or power reserve of the engine based on these real-time operating conditions. A fourth solver can be configured to perform general control tasks for the aircraft, such as by providing one or more inputs to an EEC or ECU in a controller to control one or more variable geometry components of the engine. Other solvers can similarly be used to determine other operational parameters of the engine, such as solvers configured to determine an operational range of the aircraft based on available fuel reserves, model engine deterioration, or other parameters. One skilled in the art will recognize that any number of solvers can be used to model any number of parameters in an engine. Each solver can be configured to determine the one or more parameters through, for example, an iterative process, such as by incrementally changing one or more inputs to the engine model.

Each solver can provide one or more inputs to an associated input handling unit 320. For example, as depicted in FIG. 3, each solver 310 has an associated input handling unit 320, such as a first input handling unit 320A, a second input handling unit 320B, a third input handling unit 320C, and a fourth input handling unit 320N. Each input handling unit 320 can be configured to generate a set of inputs for the engine model based at least in part on the one or more inputs obtained from each respective solver and one or more previous engine states. The one or more previous engine states can be, for example, one or more engine states from a set of outputs generated when each respective solver was previously modeled in the engine model.

An input selector unit 330 can be configured to determine a solver 310 to be run through the engine model 350. For example, the input selector unit 330 can be configured to determine a solver 310 to be run through the engine model 350 based on one or more inputs from a schedule 340. The schedule 340 can be, for example, a priority order for modelling the solvers in the engine model 350. In an embodiment, the schedule 340 can include a logic to determine a priority order to run the plurality of solvers through the engine model. For example, the schedule 340 can be configured to determine a priority for the solvers based on how critical the one or more parameters to be determined by the solvers are for operation of the engine. In another embodiment, the schedule can be a predetermined priority order for the plurality of solvers. The predetermined priority order can be, for example, a priority order stored in one or more lookup tables.

The input selector unit 330 can further be configured to obtain a set of inputs from each input handling unit 320. For example, a schedule 340 may indicate that a first solver 310A should be run through the engine model 350. The input selector unit 330 can be configured to obtain a first set of inputs from the first input handling unit 320A associated with the first solver 310A and further, provide the first set of inputs to the engine model 350. The engine model can be any engine model configured to model the operation of an engine, such as an engine 112 on an aircraft 110. For example, the engine model 350 can be an EEM configured to run on a controller 120. The engine model can be a complex, high-fidelity simulation of the engine, and can run in real-time. Further, the engine model can receive one or more inputs from one or more sensors located on the engine, such as one or more real-time sensors configured to sense one or more physical properties or operating parameters of the engine.

Once the first set of inputs has been provided by the input selector unit 330, the engine model can model the first set of inputs to generate a first set of outputs. The engine model 350 can then provide the first set of outputs to an output selector unit 360. The output selector unit 360 can be configured to provide the first set of outputs to an output handling unit 370 associated with each solver. For example, as depicted in FIG. 3, four output handling units 370 are depicted, a first output handling unit 370A associated with the first solver 310A, a second output handling unit 370B associated with the second solver 310B, a third output handling unit 370C associated with the third solver 310C, and a fourth output handling unit 370N with the fourth solver 310N. the output selector unit 360 can be configured to provide the first set of outputs to the associated output handling unit 370 based on a command from the schedule 340. For example, the schedule 340 can provide a command to the input selector unit 330 to run the first solver 310A in the engine model 350. Once the engine model 350 has modeled the first set of inputs from the first input handling unit 320A to generate the first set of outputs, the output selector unit 360 can provide the first set of outputs to the output handling unit 370A associated with the first solver. In this way, the output selector unit 360 can be configured to provide any outputs received from the engine model 350 to the output handling unit 370 associated with the solver 310 that was run through the engine model 350.

Each output handling unit 370 can be configured to provide parameter(s) 382 to the solver 310 associated with the output handling unit 370. For example, each set of the outputs can include one or more operational parameters and one or more engine states. The one or more parameters can be, for example, the one or more parameters that each solver is configured to determine. For example, a set of outputs from a solver 310 configured to determine a reserve thrust, shaft torque, or power capacity for an engine in a high-power operational state can include a parameter indicating a maximum thrust, shaft torque, or power for the engine in the high-power operational state. An output handling unit 370 associated with the solver 310 can be configured to receive the set of outputs and provide the thrust, shaft torque, or power parameter to the solver 310 as parameter(s) 382. Additionally, the parameter(s) 382 provided by an output handling unit 370 can include additional parameters, such as parameters that the solver 310 may need in an iterative process. For example, a solver 310 may be configured to determine one or more parameters of the engine by incrementally changing one or more inputs to the engine model 350 until the parameter(s) 382 provided by the output handling unit 370 reaches a threshold margin of error with a measured parameter of the engine. The solver 310 can be configured to incrementally change one or more inputs provided to the input handling unit 320 based on the parameter(s) 382 until the parameter(s) 382 are within the threshold margin of error with the measured parameter of the engine.

Each output handling unit 370 can further be configured to provide one or more engine states 384 to the respective input handling unit 320. For example, a set of outputs from an engine model can include one or more engine states 384, such as one or more setpoints for variable geometry components in the engine or one or more operating conditions of the engine. The engine states 384 can be, for example, variables that can be included in a set of inputs to an engine model 350. For example, when a high-power condition is modeled in the engine model 350, the engine states 384 can include one or more airflow parameters, turbine rotational parameters, fuel flow parameters, and other parameters which indicate the operational status or performance of the engine. In an iterative process used by a solver 310, the solver 310 can incrementally change one or more inputs, which can be provided to an input handling unit 320. The input handling unit 320 can generate a set of inputs to be provided to the engine model 350, which can include the incremented inputs from the solver 310 as well as the one or more engine states 384 received from the output handling unit 370 when the solver previously was run through the engine model 350. In this way, a set of inputs can include one or more previous engine states 384 from previously modeling the engine in the engine model 350, as well as one or more inputs received from the solver 310, such as one or more incrementally changed inputs.

In an embodiment, a controller, such as a controller 120 on an aircraft 110 can perform a control action based at least in part on the one or more parameters determined by a solver 310. For example, a solver 310 can be configured to determine a setpoint for one or more variable geometry components of an engine 112. Once the solver 310 has determined the one or more parameters by modeling the engine 112 in an engine model 350, a controller, such as an EEC or ECU, can control the one or more variable geometry components of the engine 112 to the setpoint. In an embodiment, the one or more parameters can be provided for display to a user by a controller, such as a controller 120. For example, a controller 120 can be configured to send a command to a display device, such as a display device 160 in a cockpit 116 on an aircraft 110, to display the one or more parameters.

In this way, a plurality of solvers can be run through an engine model such that when each solver is run through the engine model, a previous engine state generated from previously running the solver through the engine model can be included in a set of inputs provided to the engine model. Thus, when an input selector unit 330 selects a solver 310 to be run through the engine model 350, such as a first solver 310A, an associated input handling unit 320A can include one or more previous engine states generated by previously running the solver 310A through the engine model 350 in a set of inputs to be provided to the engine model 350. Further, when the input selector unit 330 selects a second solver 310, such as a second solver 310B, the input selector unit 330 can similarly receive a second set of inputs from the input handling unit 320B associated with second solver 310B that can include a previous engine state generated from previously modeling the second solver 310B. Thus, each time the input selector unit 330 selects a solver 310, one or more previous engine states generated from previously running the solver 310 through the engine model 350 can be included in a set of inputs, allowing the solver 310 to essentially resume modelling the engine from the point at which the model previously stopped modeling the engine. Moreover, this can allow a schedule 340 to quickly switch between multiple solvers 310, thereby allowing nearly simultaneous modeling of multiple solvers 310 in a single engine model 350.

Figure 4:
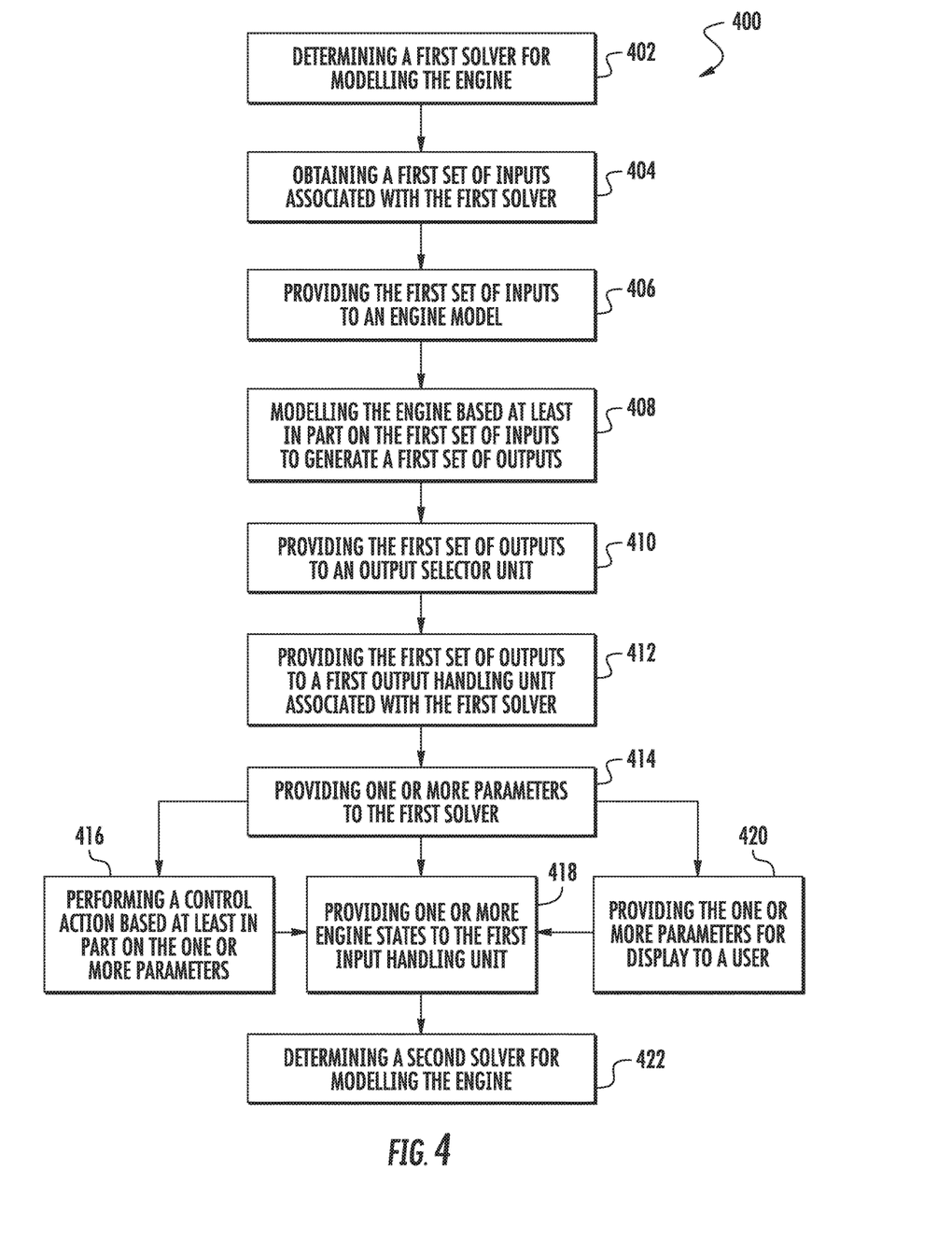
FIG. 4 depicts a flow diagram of an example method for modelling an engine in a vehicle according to example embodiments of the present disclosure.

FIG. 4 depicts a flow diagram of an example method (400) for modelling an engine on a vehicle. Some or all of the steps of method (400) can be implemented by one or more processor(s), such as one or more processor(s) on the computing device(s) shown in FIG. 5. One or more step(s) of the method (400) can be performed while the vehicle 10 is in operation, such as when an aircraft 110 is in-flight. In addition, FIG. 4 depicts steps performed in a particular order for purposes of illustration and discussion. Those of ordinary skill in the art, using the disclosures provided herein, will understand that the various steps of any of the methods disclosed herein can be modified, adapted, expanded, rearranged and/or omitted in various ways without deviating from the scope of the present disclosure.

At (402), the method (400) can include determining a first solver for modeling the engine. For example, a plurality of solvers 310 can be used to each determine one or more parameters of an engine using an engine model 350. The engine model 350 can be, for example, an EEM configured to run on a controller, such as a controller 120. Each solver 310 can be, for example, a routine or iterative process configured to determine the one or more parameters. In an embodiment, determining a first solver for modeling the engine can include selecting the first solver from a plurality of solvers by an input selector unit. For example, an input selector unit 330 can be configured to select the first solver, such as a first solver 310A, based at least in part on one or more commands from a schedule 340. The schedule 340 can be, for example, a logic to determine a priority order of the plurality of solvers 310. The schedule 340 can also be a predetermined priority order of the plurality of solvers 310.

At (404), the method (400) can include obtaining a first set of inputs associated with the first solver. The first set of inputs can include one or more inputs obtained from the first solver and one or more previous engine states. For example, a first input handling unit 320A can be configured to generate a first set of inputs based at least in part on one or more inputs provided by the first solver 310A. The input handling unit 320A can further be configured to generate the first set of inputs based at least in part on one or more engine states from a set of outputs generated from previously modeling the engine using the first solver. For example, a first solver 310A could have previously been run through an engine model 350 to generate a set of outputs, which could include an engine state 384A. The engine state 384A could have been provided to the input handling unit 320A by an output handling unit 370A associated with the first solver 310A. The input handling unit 320A can generate the first set of inputs based at least in part on both the input provided by the first solver 310A and the previous engine state 384A. In an embodiment, the first set of inputs can be obtained from the first input handling unit 320 by the input selector unit 330.

At (406), the method (400) can include providing the first set of inputs to an engine model. For example, an input selector unit 330 can provide a first set of inputs obtained from an input handling unit 320 to an engine model 350.

At (408), the method (400) can include modeling the engine based at least in part on the first set of inputs to generate a first set of outputs. For example, an input selector unit 330 can provide a first set of inputs to an engine model 350. Using the first set of inputs, the engine model 350 can generate a first set of outputs. The first set of outputs can include one or more parameters of the engine and one or more engine states. In an embodiment, the engine model can be an embedded engine model (EEM) in a controller on an aircraft. For example, a controller 120 on an aircraft 110 can include an embedded engine model. The embedded engine model can be configured to simulate the operation of an aircraft engine.

At (410), the method (400) can include providing the first set of outputs to an output selector unit. For example, an output selector unit 360 can be configured to receive the first set of outputs from the engine model 350. The output selector unit 360 can further be configured to provide the first set of outputs to one or more output handling units 370.

At (412), the method (400) can include providing the first set of outputs to a first output handling unit associated with the first solver. For example, a first output handling unit 370A can be associated with the first solver 310A. The output selector unit 360 can receive one or more commands from a schedule 340 indicative of an output handling unit 370 to which the output selector unit 360 is to provide the first set of outputs. The output selector unit 360 can then provide the first set of outputs to the output handling unit 370.

At (414) the method (400) can include providing the one or more parameters to the first solver. For example, a first output handling unit 370A can be configured to provide parameter(s) 382A to the first solver 310A. The parameter(s) 382A can be the one or more parameters that the first solver 310A was configured to determine. The parameter(s) 382A can further be one or more intermediate parameters, such as one or more parameters in an iterative process used by the first solver 310A to determine the one or more parameters of the engine. The first output handling unit 370A can provide the parameter(s) 382A to the first solver 310A.

At (416), the method (400) can include performing a control action based at least in part on the one or more parameters. For example, the parameter(s) 382A can be one or more setpoints for a variable geometry component of an engine 112. The parameter(s) 382A can be provided to a controller, such as controller 120, and based on the parameter(s) 382A, the controller 120 can control the variable engine component to the setpoint.

At (418), the method (400) can include providing the one or more engine states to the first input handling unit. For example, and output handling unit 370A can receive a first set of outputs from an output selector unit 360. The output handling unit 370A can provide one or more engine states 384A to an input handling unit 320A. The input handling unit 320A can then use the one or more engine states 384A to generate a set of inputs to be provided to the engine model 350 the next time the first solver 310A is run through the engine model 350. In this way, the first input handling unit 320A can be configured to generate a second set of inputs based at least upon one or more inputs from the solver 310A and the one or more engine states 384A.

At (420), the method (400) can include providing the one or more parameters for display to a user. For example, a user, such as a pilot on an aircraft 110 may desire to know one or more parameters of an aircraft engine 112, such as a reserve thrust, shaft torque, or power capacity. Once a solver 310 has determined the one or more parameters, a controller, such as a controller 120, can provide one or more commands to a display device, such as a display device 160 in a cockpit 116 on an aircraft 110, to display the one or more parameters. The display device 160 can then display the one or more parameters for the user.

At (422), the method (400) can include determining a second solver for modeling the engine. For example, a second solver, such as a solver 310B, can be selected from the plurality of solvers 310 to determine one or more parameters of the engine using the engine model 350. In an embodiment, determining the second solver for modeling the engine can include selecting the second solver from the plurality of solvers by an input selector unit. For example, an input selector unit 330 can be configured to select the second solver 310B based at least in part on one or more commands from a schedule 340.

Figure 5:
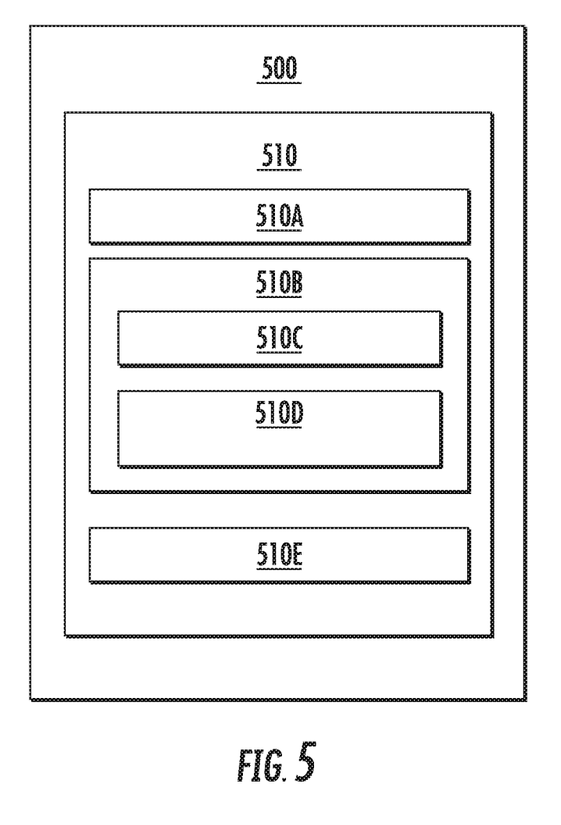
FIG. 5 depicts elements suitable for use in an example computing system according to example embodiments of the present disclosure.

Referring now to FIG. 5, an example computing system 500 for use according to example embodiments of the present disclosure is shown. The computing system 500 can be, for example, a controller, such as a controller 120 configured to control an engine 112 depicted in FIG. 2. Further, the computing system 500 can be, for example, a computing device 140 as depicted in FIG. 2. The computing system 500 can include one or more computing device(s) 510. The computing device(s) 510 can include one or more processor(s) 510A and one or more memory device(s) 510B. The one or more processor(s) 510A can include any suitable processing device, such as a microprocessor, microcontroller, integrated circuit, logic device, and/or other suitable processing device. The one or more memory device(s) 510B can include one or more computer-readable media, including, but not limited to, non-transitory computer-readable media, RAM, ROM, hard drives, flash drives, and/or other memory devices.

The one or more memory device(s) 510B can store information accessible by the one or more processor(s) 510A, including computer-readable instructions 510C that can be executed by the one or more processor(s) 510A. The instructions 510C can be any set of instructions that when executed by the one or more processor(s) 510A, cause the one or more processor(s) 510A to perform operations. In some embodiments, the instructions 510C can be executed by the one or more processor(s) 510A to cause the one or more processor(s) 510A to perform operations, such as any of the operations and functions for which the computing system 500 and/or the computing device(s) 510 are configured, the operations for modelling an engine (e.g., method 400), as described herein, and/or any other operations or functions of the one or more computing device(s) 510. The instructions 510C can be software written in any suitable programming language or can be implemented in hardware. Additionally, and/or alternatively, the instructions 510C can be executed in logically and/or virtually separate threads on processor(s) 510A. The memory device(s) 510B can further store data 510D that can be accessed by the processor(s) 510A. For example, the data 510D can include data received from one or more sensors, any inputs, such as any inputs from a solver 310 or any user inputs, any outputs, such as any engine states or any parameters, feedback, or other outputs from modelling an engine, and/or any other data and/or information described herein.

The computing device(s) 510 can also include a network interface 510E used to communicate, for example, with the other components of system 500 (e.g., via a network). The network interface 510E can include any suitable components for interfacing with one or more network(s), including for example, transmitters, receivers, ports, controllers, antennas, and/or other suitable components. One or more external display devices, such as one or more display devices 160, can be configured to receive one or more commands from the computing device(s) 510.

The technology discussed herein makes reference to computer-based systems and actions taken by and information sent to and from computer-based systems. One of ordinary skill in the art will recognize that the inherent flexibility of computer-based systems allows for a great variety of possible configurations, combinations, and divisions of tasks and functionality between and among components. For instance, processes discussed herein can be implemented using a single computing device or multiple computing devices working in combination. Databases, memory, instructions, and applications can be implemented on a single system or distributed across multiple systems. Distributed components can operate sequentially or in parallel.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the present disclosure, including the best mode, and also to enable any person skilled in the art to practice the present disclosure, including making and using any devices or systems and performing any incorporated methods. The patentable scope of the present disclosure is defined by the claims, and can include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of modelling an engine on a vehicle in an engine model, the method comprising:

obtaining, by the one or more processors, a first set of inputs, wherein the first set of inputs comprises one or more inputs obtained from a first solver, the first solver being a modeling component including software instructions and one or more real-time sensors configured to sense one or more physical properties and operating parameters of the engine, and one or more inputs associated with one or more previous engine states modeled;

providing the first set of inputs to the engine model for modelling, by the one or more processors, the engine being based at least in part on the first set of inputs to generate a first set of outputs, wherein the first set of outputs comprises one or more parameters of the engine and one or more current engine states based on the engine model; and providing, by the one or more processors, the one or more parameters to the first solver.

2. The method of claim 1, wherein the one or more previous engine states comprise one or more engine states from a second set of outputs, wherein the second set of outputs comprises a set of outputs generated from previously modelling the engine using the first solver.

3. The method of claim 1, wherein the method further comprises:

performing a control action for the engine by the one or more processors based at least upon the one or more parameters.

4. The method of claim 1, wherein the method further comprises:

providing the one or more parameters for display to a user by the one or more processors.

5. The method of claim 1, further comprising selecting, by the one or more processors, the first solver from a plurality of solvers by an input selector unit.

6. The method of claim 5, wherein selecting, by the one or more processors, the first solver based on a schedule, wherein the schedule comprises one of a logic to determine a priority order of the plurality of solvers or a predetermined priority order of the plurality of solvers.

7. The method of claim 5, wherein obtaining, by the one or more processors, a first set of inputs associated with the first solver comprises obtaining the first set of inputs from a first input handling unit associated with the first solver by the input selector unit.

8. The method of claim 1, wherein the engine model comprises an embedded engine model in a controller on an aircraft, wherein the embedded engine model is configured to simulate the operation of an aircraft engine.

9. The method of claim 1, wherein following modelling, by the one or more processors, the engine based at least in part on the first set of inputs to generate a first set of outputs the method further comprises:
providing, by the one or more processors, the first set of outputs to an output selector unit.

10. The method of claim 9, wherein following providing the first set of outputs to an output selector unit, the method further comprises:
providing, by the one or more processors, the first set of outputs to a first output handling unit associated with the first solver.

11. The method of claim 10, further comprising providing, by the one or more processors, the one or more parameters to the first solver by the first output handling unit.

12. The method of claim 11, wherein further comprising:
incrementally adjusting the one or more inputs until the one or more parameters of the first output handling unit are within a threshold margin of error with measured parameters of the engine.

13. The method of claim 10, further comprising:
providing the one or more previous engine states in the first set of outputs to the first input handling unit by the first output handling unit.

14. The method of claim 13, wherein the first input handling unit is configured to generate a second set of inputs based at least upon one or more first inputs from the first solver and the one or more previous engine states.

15. The method of claim 1, further comprising:
determining, by the one or more processors, a second solver being a component configured to model the engine, wherein the second solver comprises a second routine configured to determine at least one parameter of the engine.

16. A system for modelling an engine on an aircraft in an engine model, comprising:
one or more processors; and
one or more memory devices, the one or more memory devices storing instructions that when executed by the one or more processors configure the one or more processors to:
obtain a first set of inputs, wherein the first set of inputs comprises one or more inputs obtained from a first solver, the first solver being a modeling component including software instructions and one or more real-time sensors configured to sense one or more physical properties and operating parameters of the engine, and one or more inputs associated with previous engine states modeled;
model the engine based at least in part on the first set of inputs to generate a first set of outputs, wherein the first set of outputs comprises one or more parameters of the engine and one or more current engine states based on the engine model; and
provide the one or more parameters to the first solver.

17. The system of claim 16, wherein the one or more previous engine states comprise one or more engine states from a second set of outputs, wherein the second set of outputs comprises a set of outputs generated from previously modelling the engine by the one or more processors using the first solver.

18. The system of claim 16, wherein the instructions further configured the one or more processors to perform a control action for the engine based at least upon the one or more parameters or provide the one or more parameters for display to a user.

19. An aircraft, comprising:
a fuselage;
at least one engine; and
a controller configured to control the at least one engine and to generate an engine model based on the at least one engine, the controller
comprising:
one or more processors; and
one or more memory devices, the one or more memory devices storing instructions that when executed by the one or more processors configure the one or more processors to:
obtain a first set of inputs, wherein the first set of inputs comprises one or more inputs obtained from a first solver, the first solver being a modeling component including software instructions and one or more real-time sensors configured to sense one or more physical properties and operating parameters of the engine, and one or more previous engine states modeled;
model the engine based at least in part on the first set of inputs to generate a first set of outputs, wherein the first set of outputs comprises one or more parameters of the engine and one or more current engine states based on the engine model; and
provide the one or more parameters to the first solver.

20. The aircraft of claim 19, wherein the one or more previous engine states comprise one or more engine states from a second set of outputs, wherein the second set of outputs comprises a set of outputs generated from previously modelling the engine by the one or more processors using the first solver.

* * * * *